United States Patent
Hu et al.

(10) Patent No.: US 11,664,058 B1
(45) Date of Patent: May 30, 2023

(54) MEMORY DEVICE AND OPERATION METHOD THEREOF

(71) Applicant: MACRONIX INTERNATIONAL CO., LTD., Hsinchu (TW)

(72) Inventors: Han-Wen Hu, Tainan (TW); Yung-Chun Li, New Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 17/564,340

(22) Filed: Dec. 29, 2021

(51) Int. Cl.
    *G11C 7/14* (2006.01)
    *G11C 7/10* (2006.01)
    *H03K 19/017* (2006.01)
    *G11C 7/12* (2006.01)
    *G11C 8/08* (2006.01)

(52) U.S. Cl.
    CPC .............. *G11C 7/14* (2013.01); *G11C 7/1039* (2013.01); *G11C 7/1063* (2013.01); *G11C 7/12* (2013.01); *G11C 8/08* (2013.01); *H03K 19/01742* (2013.01)

(58) Field of Classification Search
    CPC ....................................................... G11C 7/14
    USPC ....................................................... 365/185.2
    See application file for complete search history.

(56) References Cited

U.S. PATENT DOCUMENTS

| | | | | |
|---|---|---|---|---|
| 5,510,749 A | * | 4/1996 | Arimoto | G05F 1/465 327/332 |
| 6,081,453 A | * | 6/2000 | Iwahashi | G11C 11/5635 365/185.18 |
| 9,824,758 B2 | * | 11/2017 | Lee | G11C 16/08 |
| 2010/0085799 A1 | * | 4/2010 | Cho | G11C 13/004 365/207 |
| 2011/0235420 A1 | * | 9/2011 | Sharon | G11C 16/3454 365/185.21 |
| 2021/0255916 A1 | * | 8/2021 | Im | G11C 29/028 |

\* cited by examiner

*Primary Examiner* — Muna A Techane
(74) *Attorney, Agent, or Firm* — McClure, Qualey & Rodack, LLP

(57) ABSTRACT

A memory device and an operation method thereof are provided. The operation method includes: in a first phase, selecting a global signal line, selecting a first string select line, unselecting a second string select line, selecting a first word line, and unselecting a second word line; sensing during a second phase; in a third phase, keeping voltages of the global signal line, the selected first word line and the unselected second word line, unselecting the first string select line and selecting the second string select line to switch voltages of the first and the second string select lines; and sensing during a fourth phase.

12 Claims, 6 Drawing Sheets

MEMORY DEVICE AND OPERATION METHOD THEREOF

TECHNICAL FIELD

The disclosure relates in general to a memory device and an operation method thereof.

BACKGROUND

Artificial Intelligence ("AI") has recently emerged as a highly effective solution for many fields. The key issue in AI is that AI contains large amounts of input data (for example input feature maps) and weights to perform multiply-accumulation (MAC).

However, the current AI structure usually encounters IO (input/output) bottleneck and inefficient MAC operation flow.

In order to achieve high accuracy, it would perform MAC operations having multi-bit inputs and multi-bit weights. But, the IO bottleneck becomes worse and the efficiency is lower.

In-Memory-Computing ("IMC") can accelerate MAC operations because IMC may reduce complicated arithmetic logic unit (ALU) in the process centric architecture and provide large parallelism of MAC operation in memory.

In executing IMC, if the background set time for multiplication operations is reduced, then the IMC performance will be improved.

SUMMARY

According to one embodiment, provided is an operation method for a memory device including a plurality of memory cells. The operation method includes: in a first phase, selecting a global signal line to pull up the global signal line from a first reference voltage to a second reference voltage, selecting a first string select line to pull up the first string select line from the first reference voltage to a third reference voltage, unselecting a second string select line to keep the second string select line at the first reference voltage, selecting a first word line to pull up the first word line from the first reference voltage to a fourth reference voltage, and unselecting a second word line to pull up the second word line from the first reference voltage to a fifth reference voltage; sensing during a second phase; in a third phase, keeping the global signal line at the second reference voltage, unselecting the first string select line to pull down the first string select line from the third reference voltage to the first reference voltage, selecting the second string select line to pull up the second string select line from the first reference voltage to the third reference voltage, keeping the selected first word line at the fourth reference voltage and keeping the unselected second word line at the fifth reference voltage; and sensing during a fourth phase.

According to another embodiment, provided is an operation method for a memory device including a plurality of memory cells. The operation method includes: in a first phase, selecting a global signal line to pull up the global signal line from a first reference voltage to a second reference voltage, selecting a first string select line to pull up the first string select line from the first reference voltage to a third reference voltage, unselecting a second string select line to keep the second string select line at the first reference voltage, selecting a first word line to pull up the first word line from the first reference voltage to a fourth reference voltage, and unselecting a second word line to pull up the second word line from the first reference voltage to a fifth reference voltage; sensing during a second phase; in a third phase, keeping the global signal line at the second reference voltage, keeping the selected first string select line at the third reference voltage, keeping the unselected second string select line at the first reference voltage, unselecting the first word line to pull up the first word line from the fourth reference voltage to the fifth reference voltage and selecting the second word line to pull down the second word line from the fifth reference voltage to the fourth reference voltage; and sensing during a fourth phase.

According to still another one embodiment, provided is a memory device. The memory device includes: a plurality of memory cells; a plurality of global signal lines; a plurality of bit lines coupled to the memory cells; a plurality of string select lines; a plurality of word line lines coupled to the memory cells; a plurality of first switches coupled to the string select lines and the bit lines; and a plurality of second switches coupled to the global signal lines and the bit lines; wherein in a first phase, selecting a global signal line of the global signal lines to pull up the global signal line from a first reference voltage to a second reference voltage, selecting a first string select line of the string select lines to pull up the first string select line from the first reference voltage to a third reference voltage, unselecting a second string select line of the string select lines to keep the second string select line at the first reference voltage, selecting a first word line of the word lines to pull up the first word line from the first reference voltage to a fourth reference voltage, and unselecting a second word line of the word lines to pull up the second word line from the first reference voltage to a fifth reference voltage; sensing during a second phase; in a third phase, keeping the global signal line at the second reference voltage, unselecting the first string select line to pull down the first string select line from the third reference voltage to the first reference voltage, selecting the second string select line to pull up the second string select line from the first reference voltage to the third reference voltage, keeping the selected first word line at the fourth reference voltage, and keeping the unselected second word line at the fifth reference voltage; and sensing during a fourth phase.

Figure 1:
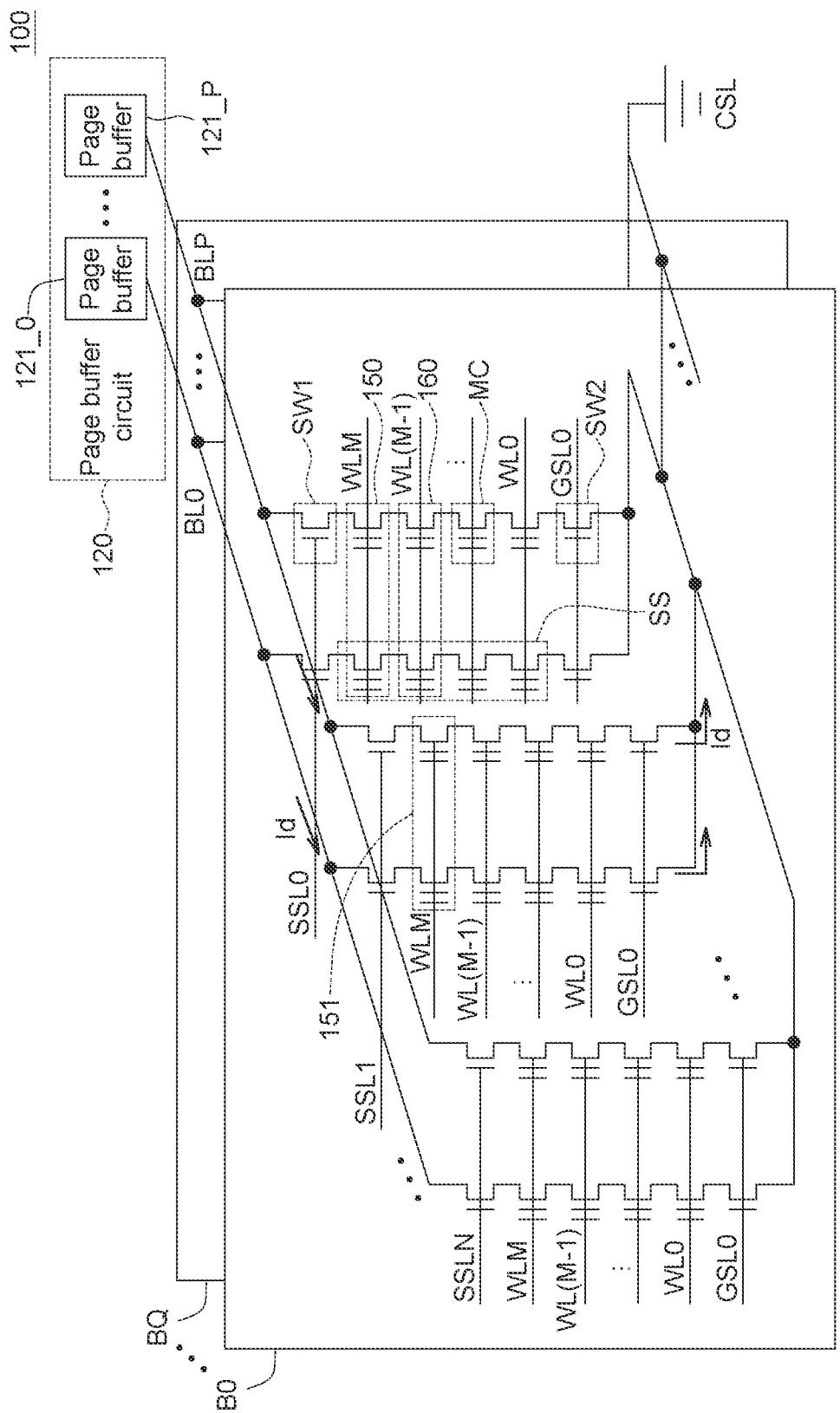
Fig. 1 shows a circuit diagram of a memory device according to one embodiment of the application.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DESCRIPTION OF THE EMBODIMENTS

Technical terms of the disclosure are based on general definition in the technical field of the disclosure. If the disclosure describes or explains one or some terms, definition of the terms is based on the description or explanation of the disclosure. Each of the disclosed embodiments has one or more technical features. In possible implementation, one skilled person in the art would selectively implement part or all technical features of any embodiment of the disclosure or selectively combine part or all technical features of the embodiments of the disclosure.

FIG. 1 shows a circuit diagram of a memory device 100 according to one embodiment of the application. The memory device 100 is for example but not limited by a three-dimension (3D) memory device. As shown in FIG. 1, the memory device 100 includes a plurality of memory blocks B0-BQ (Q being a positive integer), a page buffer circuit 120, a common source line CSL, a plurality of global source lines (also referred as global signal lines) GSL0-GSLQ, a plurality of string select lines SSL0-SSLN (N being a positive integer), a plurality of word lines WL0-WLM (M being a positive integer) and a plurality of bit lines BL0-BLP (P being a positive integer).

Each of the memory blocks B0-BQ includes a plurality of switches SW1, a plurality of switches SW2 and a plurality of memory strings SS. Each of the memory strings SS includes a plurality of memory cells MC. The memory cells MC are at intersections of the word lines WL0-WLM and the bit lines BL0-BLP. In the same memory block, the memory cells coupled to the same bit line form a memory string SS.

The switches SW1 are at intersections of the string select lines SSL0-SSLN and the bit lines BL0-BLP. When a corresponding memory string SS is selected, a corresponding switch SW1 is turned on.

The switches SW2 are at intersections of the global signal lines GSL0-GSLQ and the bit lines BL0-BLP, When a corresponding memory block is selected, a corresponding switch SW2 is turned on.

A plurality of cell currents Id flowing through the memory strings SS are input into a backend corresponding circuit (for example but not limited by, an accumulation circuit) via the common source line CSL, to perform corresponding operations (for example but not limited by, Multiply-Accumulate (MAC) operations, data reading operations, data write operations and so on).

The page buffer circuit 120 includes a plurality of page buffers 121_0-121_P. Each of the page buffers 121_0-121_P is coupled to one among the bit lines BL0-BLP.

Figure 2:
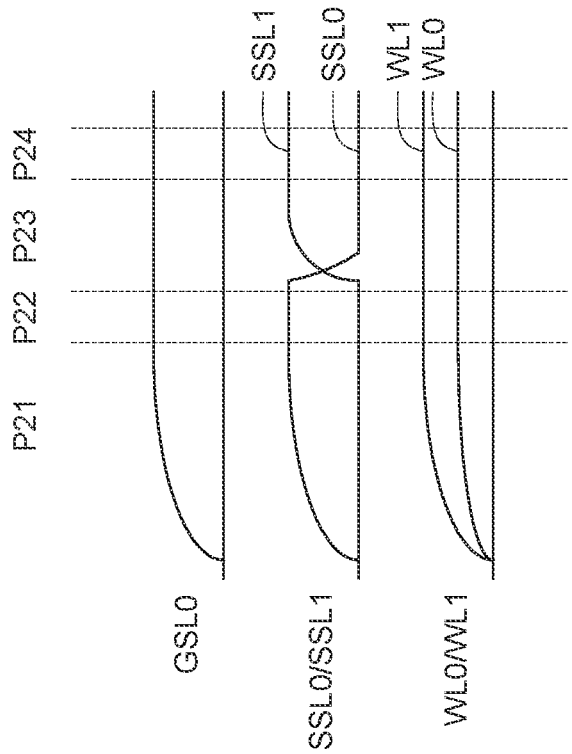
FIG. 2 shows a waveform and an operation diagram for an operation method of a memory device according to one embodiment of the application.
Figure 2:
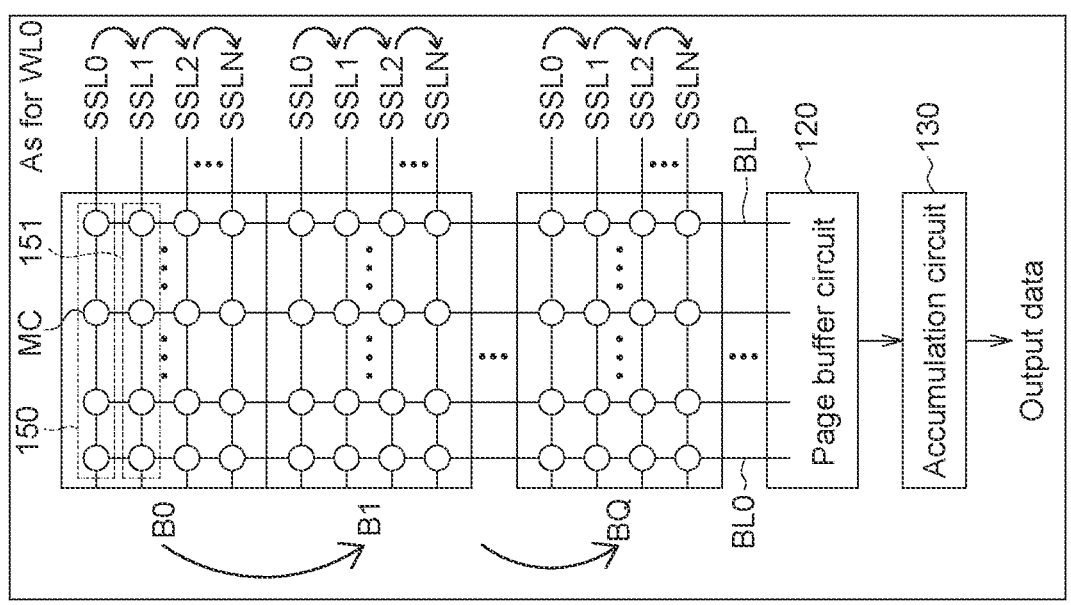

FIG. 2 shows a waveform and an operation diagram for an operation method of a memory device according to one embodiment of the application. In FIG. 2, for simplicity, the memory cells MC coupled to the same word line (for example WL0) are shown to clearly show operations in switching the string select lines. Further, in switching the string select lines, although FIG. 2 shows the sequential switch (SSL0→SSL1 . . . ), but the application is not limited by this. Switching of the string select lines may have different sequences, which are still within the spirit and scope of the application.

In the following, the memory block B0 (corresponding to the global source line GSL0), the string select lines SSL0, SSL1 and the word lines WL0, WL1 are taken as an example, but the application is not limited by this. It is assumed that, another memory block is accessed. But after address decoding, next data is stored in the memory cells on the intersections of the string select line SSL0 and the word line WL0 of the memory block B0 (that is, the string select line SSL0 is the selected string select line and the word line WL0 is the selected word line).

During the phase P21 (i.e. an initial phase), the global source line GSL0 is selected to pull up from a first reference voltage to a second reference voltage; the string select line SSL0 is selected to pull up from the first reference voltage to a third reference voltage; other string lines SSL1~SSLN are unselected to maintain at the first reference voltage; the word line WL0 is selected to pull up from the first reference voltage to a fourth reference voltage; and other word lines WL1~WLM are unselected to pull up from the first reference voltage to a fifth reference voltage higher than the fourth reference voltage. By so, the memory cells MC in the region 150 are selected, as shown in FIG. 1 and FIG. 2.

During the phase P22, a sensing operation is performed.

Then, after address decoding, next data is stored in the memory cells on the intersections of the string select line SSL1 and the word line WL0 of the memory block B0 (that is, the string select line SSL1 is the selected string select line and the word line WL0 is the selected word line). That is, the selected string select line is changed from the string select line SSL0 to the string select line SSL1 while the selected word line is unchanged (the word line WL0).

During the phase P23, the selected global source line GSL0 is maintained at the second reference voltage; the string select line SSL0 is unselected to pull down from the third reference voltage to the first reference voltage; all other unselected string select lines SSL2~SSLN are maintained at the first reference voltage; the string select line SSL1 is selected to pull up from the first reference voltage to the third reference voltage; the selected word line WL0 is maintained at the fourth reference voltage; and all the unselected word lines WL1~WLM are maintained at the fifth reference voltage. By so, the memory cells MC in the region 151 are selected, as shown in FIG. 1 and FIG. 2.

During the phase P24, a sensing operation is performed.

Similarly, after address decoding, in order to access next data, the selected string select line is changed (for example, from the string select line SSL1 to the string select line SSL2) but the selected word line is unchanged. Then, during the next phase, the selected global source line GSL0 is maintained at the second reference voltage; the string select line SSL1 is unselected to pull down from the third reference voltage to the first reference voltage; all other unselected string select lines SSL0 and SSL3~SSLN are maintained at the first reference voltage; the string select line SSL2 is selected to pull up from the first reference voltage to the third reference voltage; the selected word line WL0 is maintained at the fourth reference voltage; and all the unselected word lines WL1~WLM are maintained at the fifth reference voltage.

Similarly, after address decoding, in order to access next data, the selected memory block is switched from the memory block B0 to another memory block, then the initial operation as shown in the phase P21 is performed again.

As shown in FIG. 2, the memory device 100 further includes an accumulation circuit 130 coupled to the page buffer circuit 120.

Data read from the selected memory cells MC are input into the page buffer circuit 120 and then sent to the accumulation circuit 130 (but the application is not limited by) for MAC operations to generate output data.

That is, in the operation method shown in FIG. 2, after the initialization phase (P21), in the case that data stored in the same memory block is accessed, when the selected string select line is switched, voltages of the global source line, the selected word line and the unselected word line are maintained; and the voltages of the next-selected string select line and the currently-selected string select line are switched (in the phase P23). By so, the background setup time of the memory device is shortened (the phases P21-P24 may be considered as the bit line setup time and the word line setup time of the multiplication operations of the MAC operations).

Further, in the embodiment in FIG. 2, via switching the memory blocks and the string select lines, compared with the prior a the word line setup time is reduced and thus the operations are accelerated.

Still further, in the embodiment in FIG. 2, when the memory device includes a plurality of memory planes and each of the memory planes includes a respective accumulation circuit, then the accumulation and output of the MAC operations are performed in pipelines.

Figure 3:
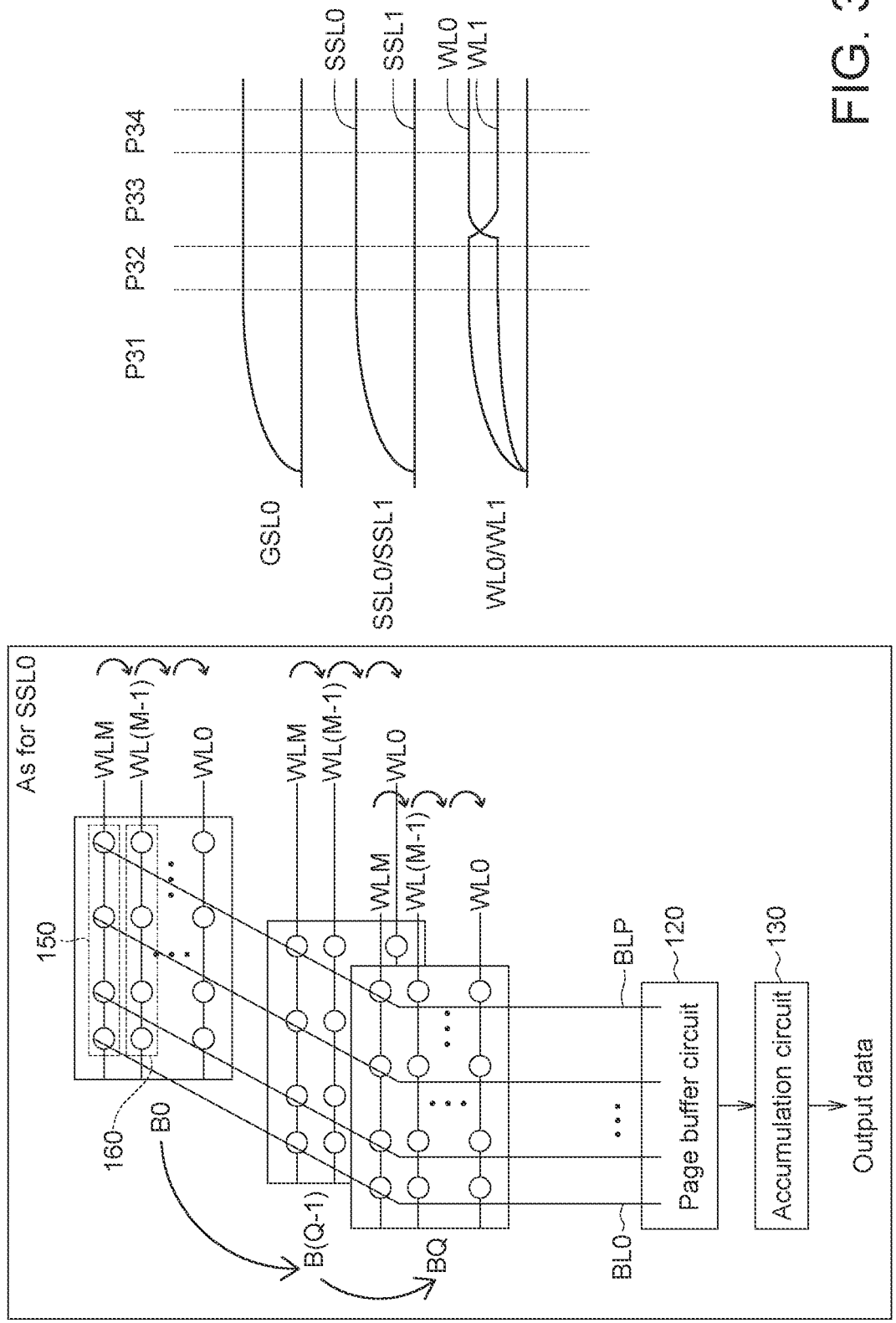
FIG. 3 shows a waveform and an operation diagram for an operation method of a memory device according to one embodiment of the application.

FIG. 3 shows a waveform and an operation diagram for an operation method of a memory device according to one embodiment of the application. In FIG. 3, for simplicity, the memory cells MC coupled to the same string select (for example SSL0) are shown to clearly show operations in switching the word line lines. Further, in switching the word line lines, although FIG. 3 shows the sequential switch (WL0→WL1 ... ), but the application is not limited by this. Switching of the word line lines may have different sequences, which are still within the spirit and scope of the application.

In the following, the memory block B0 (corresponding to the global source line GSL0), the string select lines SSL0, SSL1 and the word lines WL0, WL1 are taken as an example, but the application is not limited by this. It is assumed that, another memory block is accessed. But after address decoding, next data is stored in the memory cells on the intersections of the string select line SSL0 and the word line WL0 of the memory block B0 (that is, the string select line SSL0 is the selected string select line and the word line WL0 is the selected word line).

During the phase P31 (i.e. an initial phase), the global source line GSL0 is selected to pull up from the first reference voltage to the second reference voltage; the string select line SSL0 is selected to pull up from the first reference voltage to the third reference voltage; other string lines SSL1~SSLN are unselected to maintain at the first reference voltage; the word line WL0 is selected to pull up from the first reference voltage to the fourth reference voltage; and other word lines WL1~WLM are unselected to pull up from the first reference voltage to the fifth reference voltage higher than the fourth reference voltage. By so, the memory cells MC in the region 150 are selected, as shown in FIG. 1 and FIG. 3.

During the phase P32, a sensing operation is performed.

Then, after address decoding, next data is stored in the memory cells on the intersections of the string select line SSL0 and the word line WL1 of the memory block B0 (that is, the string select line SSL0 is still the selected string select line and the word line WL1 is the selected word line). That is, the selected string select line is unchanged (still the string select line SSL0) while the selected word line is changed (from the word line WL0 to the word line WL1).

During the phase P33, the selected global source line GSL0 is maintained at the second reference voltage; the selected string select line SSL0 is maintained at the third reference voltage; the unselected string select lines SSL1~SSLN are maintained at the first reference voltage; the word line WL0 is unselected to pull up from the fourth reference voltage to the fifth reference voltage; all other unselected word lines WL2~WLM are maintained at the fourth reference voltage; and the word line WL1 is selected to pull down from the fifth reference voltage to the fourth reference voltage. By so, the memory cells MC in the region 160 are selected, as shown in FIG. 1 and FIG. 3.

During the phase P34, a sensing operation is performed.

Similarly, after address decoding, in order to access next data, the selected word line is changed (for example, from the word line WL1 to the word line WL2) but the selected string select line is unchanged. Then, during the next phase, the selected global source line GSL0 is maintained at the second reference voltage; the selected string select line SSL0 is maintained at the third reference voltage; the unselected string select lines SSL1~SSLN are maintained at the first reference voltage; the word line WL1 is unselected to pull up from the fourth reference voltage to the fifth reference voltage; all other unselected word lines WL0, WL3~WLM are maintained at the fifth reference voltage; and the word line WL2 is selected to pull down from the fifth reference voltage to the fourth reference voltage.

Data read from the selected memory cells MC are input into the page buffer circuit 120 and then sent to the accumulation circuit 130 (but the application is not limited by) for MAC operations to generate output data.

That is, in the operation method shown in FIG. 3, after the initialization phase (P31), in the case that data stored in the same memory block is accessed, when the selected word line is switched, voltages of the global source line, the selected string select line and the unselected string select line are maintained; and the voltages of the next-selected word line and the currently-selected word line are switched (in the phase P33). By so, the background setup time of the memory device is shortened (the phases P31-P34 may be considered as the bit line setup time and the word line setup time of the multiplication operations of the MAC operations).

Further, in the embodiment in FIG. 3, via switching the memory blocks, the string select lines and the word lines, compared with the prior art, the word line setup time is reduced and thus the operations are accelerated.

Still further, in the embodiment in FIG. 3, when the memory device includes a plurality of memory planes and each of the memory planes includes a respective accumulation circuit, then the accumulation and output of the MAC operations are performed in pipelines.

Figure 4:
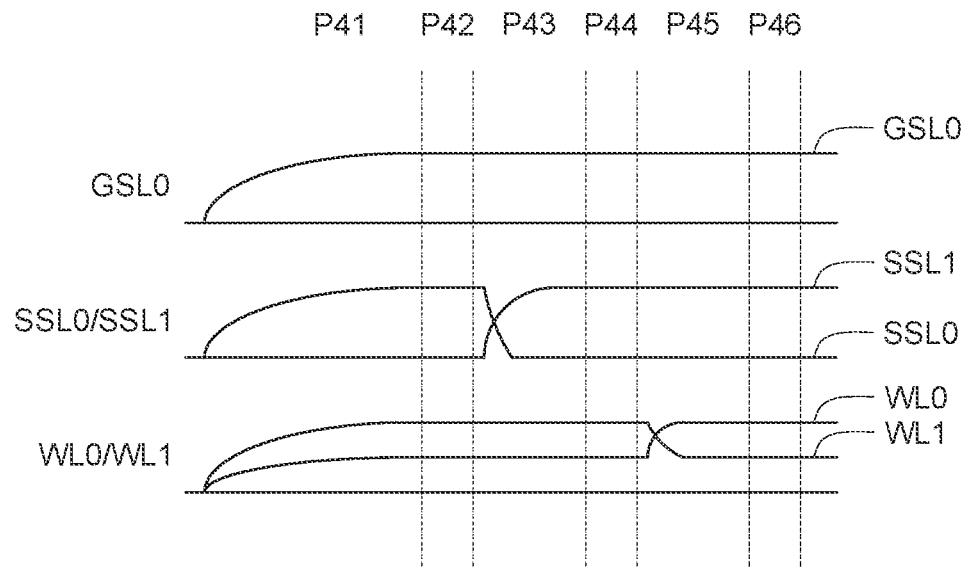
FIG. 4 and FIG. 5 show operation methods according to other embodiments of the application.
Figure 5:
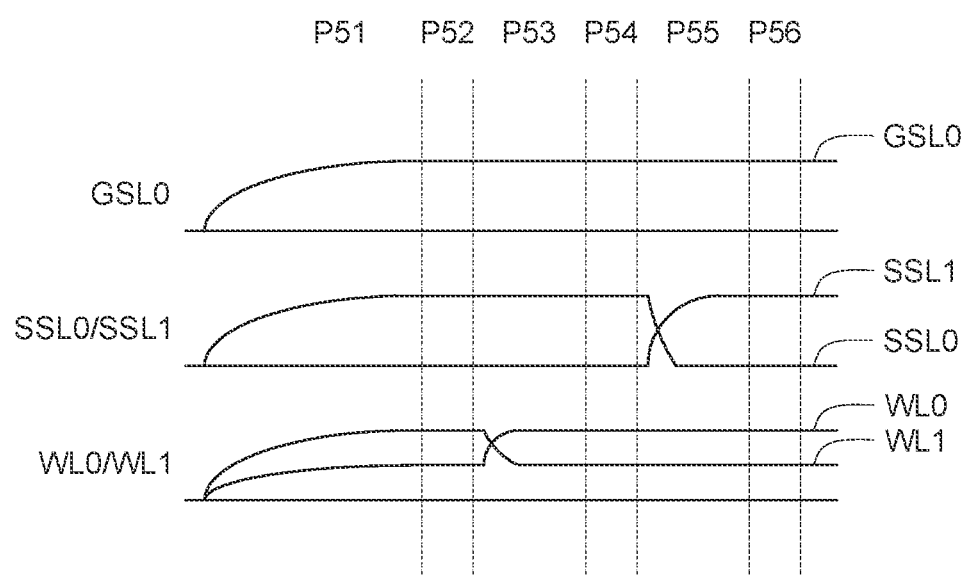

Still further, in other possible embodiment of the application, the operation methods in FIG. 2 and FIG. 3 may be combined in needed, which is still within the spirit and the scope of the application. FIG. 4 and FIG. 5 show operation methods according to other embodiments of the application.

The phases P41-P44 in FIG. 4 are the same or similar to the phases P21-P24 in FIG. 2; and the phases P45-P46 in FIG. 4 are the same or similar to the phases P33-P34 in FIG. 3. Details are omitted here.

That is, in FIG. 4, the selected string select lines are switched (the selected string select line is switched from the string select line SSL0 to the string select line SSL1 in the phase P43), and then the selected word line is switched (the selected word line is switched from the word line WL0 to the word line WL1 in the phase P45).

The phases P51-P54 in FIG. 5 are the same or similar to the phases P31-P34 in FIG. 3; and the phases P55-P56 in FIG. 5 are the same or similar to the phases P23-P24 in FIG. 2. Details are omitted here.

That is, in FIG. 5. the selected word line is switched (the selected word line is switched from the word line WL0 to the word line WL1 in the phase P53); and then the selected string select lines are switched (the selected string select line is switched from the string select line SSL0 to the string select line SSL1 in the phase P55).

Figure 6:
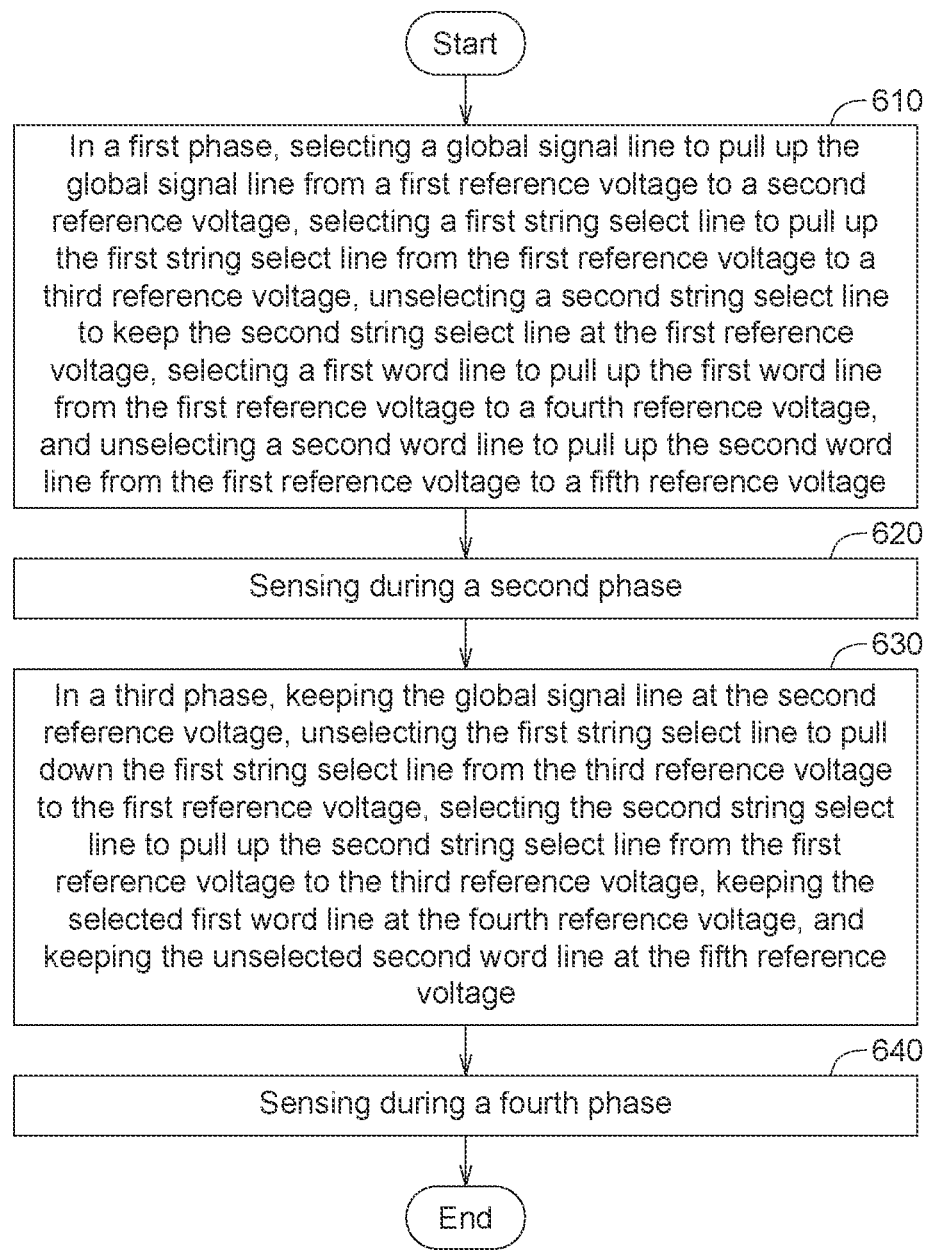
FIG. 6 shows an operation method for a memory device according to one embodiment.

FIG. 6 shows an operation method for a memory device according to one embodiment. The operation method includes: (610) in a first phase, selecting a global signal line to pull up the global signal line from a first reference voltage to a second reference voltage, selecting a first string select line to pull up the first string select line from the first reference voltage to a third reference voltage, unselecting a second string select line to keep the second string select line at the first reference voltage, selecting a first word line to pull up the first word line from the first reference voltage to a fourth reference voltage, and unselecting a second word line to pull up the second word line from the first reference voltage to a fifth reference voltage; (620) sensing during a second phase; (630) in a third phase, keeping the global signal line at the second reference voltage, unselecting the first string select line to pull down the first string select line from the third reference voltage to the first reference voltage, selecting the second string select line to pull up the second string select line from the first reference voltage to the third reference voltage, keeping the selected first word line at the fourth reference voltage, and keeping the unselected second word line at the fifth reference voltage; and (640) sensing during a fourth phase.

Figure 7:
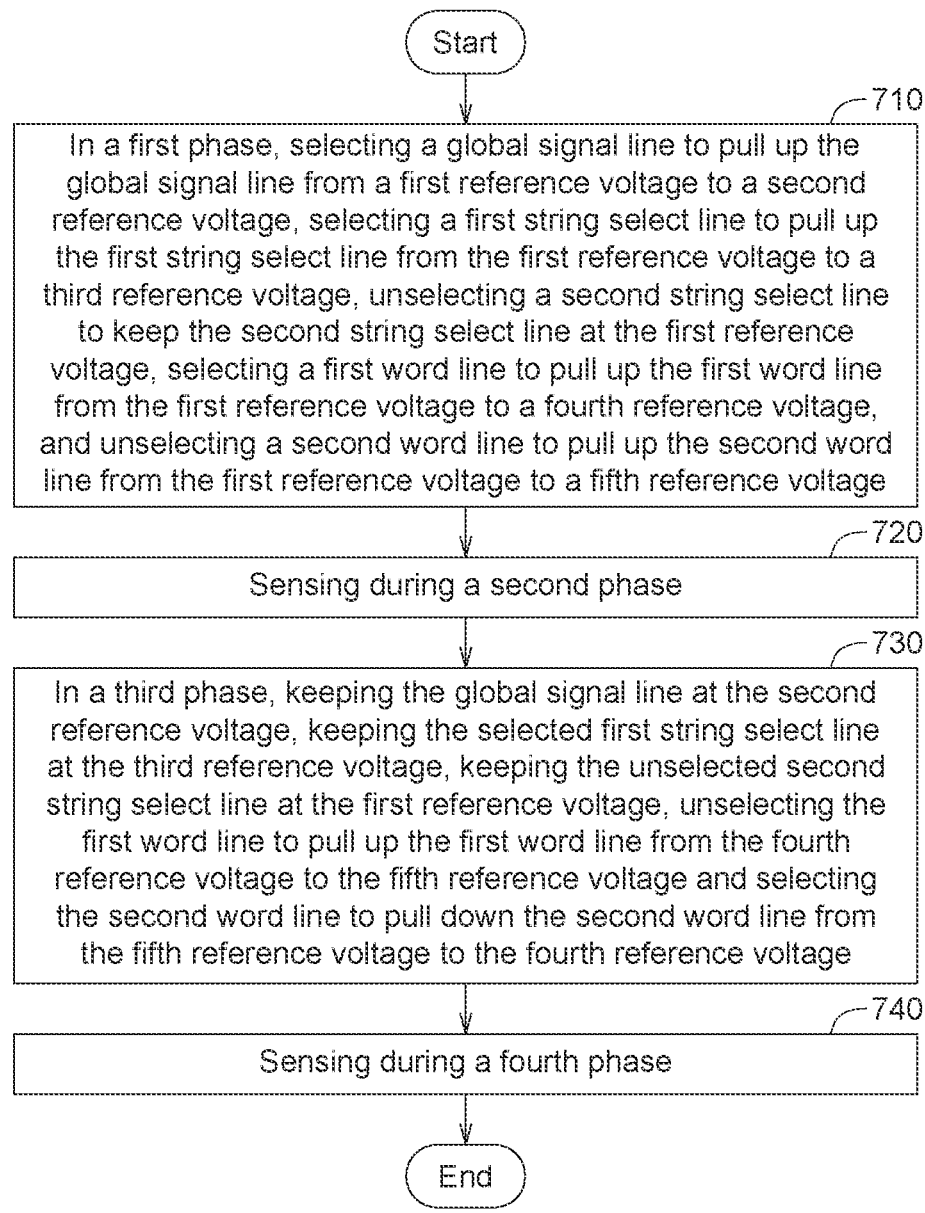
Fig. 7 shows an operation method for a memory device according to one embodiment.

FIG. 7 shows an operation method for a memory device according to one embodiment. The operation method includes: (710) in a first phase, selecting a global signal line to pull up the global signal line from a first reference voltage to a second reference voltage, selecting a first string select line to pull up the first string select line from the first reference voltage to a third reference voltage, unselecting a second string select line to keep the second string select line at the first reference voltage, selecting a first word line to pull up the first word line from the first reference voltage to a fourth reference voltage, and unselecting a second word line to pull up the second word line from the first reference voltage to a fifth reference voltage; (720) sensing during a second phase; (730) in a third phase, keeping the global signal line at the second reference voltage, keeping the selected first string select line at the third reference voltage, keeping the unselected second string select line at the first reference voltage, unselecting the first word line to pull up the first word line from the fourth reference voltage to the fifth reference voltage and selecting the second word line to pull down the second word line from the fifth reference voltage to the fourth reference voltage; and (740) sensing during a fourth phase.

In embodiments of the application, faster operations are provided (for example but not limited by, faster MAC operations, faster data read/write) because the background setup time before the sensing phase is reduced (for example, the bit line setup time and the word line setup time in the multiplication operations of the MAC operations are reduced).

The embodiments of the application are applied to three dimension (3D) NAND type flash memory, or the memory device sensitive to the retention and thermal variation, for example but not limited by, 3D NOR type flash memory, phase changing memory, magnetic RAM or resistive RAM.

The embodiments of the application may be implemented to different AI (artificial intelligence) model design which needs to perform multiple MAC operations, for example but not limited by, fully connection layer, convolution layer, Multilayer perceptron, support vector machine and so on.

The embodiments of the application may be implemented to accelerate MAC operations, read operations, and write operations and so on.

The embodiments of the application may be implemented in computing usage, data search, data analysis, clustering analysis and so on.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An operation method for a memory device including a plurality of memory cells, the operation method including:
   in a first phase, selecting a global signal line to pull up the global signal line from a first reference voltage to a second reference voltage, selecting a first string select line to pull up the first string select line from the first reference voltage to a third reference voltage, unselecting a second string select line to keep the second string select line at the first reference voltage, selecting a first word line to pull up the first word line from the first reference voltage to a fourth reference voltage, and unselecting a second word line to pull up the second word line from the first reference voltage to a fifth reference voltage;
   sensing during a second phase;
   in a third phase, keeping the global signal line at the second reference voltage, unselecting the first string select line to pull down the first string select line from the third reference voltage to the first reference voltage, selecting the second string select line to pull up the second string select line from the first reference voltage to the third reference voltage, keeping the selected first word line at the fourth reference voltage, and keeping the unselected second word line at the fifth reference voltage; and
   sensing during a fourth phase.

2. The operation method for memory device according to claim 1, wherein
   the memory device further includes a page buffer circuit and an accumulating circuit; and
   data read from at least one selected memory cell among the memory cells is input to the page buffer circuit and the accumulating circuit for performing multiplication accumulation (MAC) to generate an output data.

3. The operation method for memory device according to claim 1, wherein the memory device further includes a plurality of memory planes; each of the memory planes includes an accumulating circuit; and accumulation and output of MAC operations are performed in pipeline.

4. The operation method for memory device according to claim 1, further including:
   in a fifth phase, keeping the global signal line at the second reference voltage, keeping the selected second string select line at the third reference voltage, keeping the unselected first string select line at the first reference voltage, unselecting the first word line to pull up the first word line from the fourth reference voltage to the fifth reference voltage and selecting the second word line to pull down the second word line from the fifth reference voltage to the fourth reference voltage; and
   sensing during a sixth phase.

5. An operation method for a memory device including a plurality of memory cells, the operation method including:

in a first phase, selecting a global signal line to pull up the global signal line from a first reference voltage to a second reference voltage, selecting a first string select line to pull up the first string select line from the first reference voltage to a third reference voltage, unselecting a second string select line to keep the second string select line at the first reference voltage, selecting a first word line to pull up the first word line from the first reference voltage to a fourth reference voltage, and unselecting a second word line to pull up the second word line from the first reference voltage to a fifth reference voltage;

sensing during a second phase;

in a third phase, keeping the global signal line at the second reference voltage, keeping the selected first string select line at the third reference voltage, keeping the unselected second string select line at the first reference voltage, unselecting the first word line to pull up the first word line from the fourth reference voltage to the fifth reference voltage and selecting the second word line to pull down the second word line from the fifth reference voltage to the fourth reference voltage; and sensing during a fourth phase.

6. The operation method for memory device according to claim 5, wherein
the memory device further includes a page buffer circuit and an accumulating circuit; and
data read from at least one selected memory cell among the memory cells is input to the page buffer circuit and the accumulating circuit for performing multiplication accumulation (MAC) to generate an output data.

7. The operation method for memory device according to claim 5, wherein the memory device further includes a plurality of memory planes; each of the memory planes includes an accumulating circuit; and accumulation and output of MAC operations are performed in pipeline.

8. The operation method for memory device according to claim 5, further including:
in a fifth phase, keeping the global signal line at the second reference voltage, unselecting the first string select line to pull down the first string select line from the third reference voltage to the first reference voltage, selecting the second string select line to pull up the second string select line from the first reference voltage to the third reference voltage, keeping the selected second word line at the fourth reference voltage, and keeping the unselected first word line at the fifth reference voltage; and
sensing during a sixth phase.

9. A memory device including:
a plurality of memory cells;
a plurality of global signal lines;
a plurality of bit lines coupled to the memory cells;
a plurality of string select lines;
a plurality of word line lines coupled to the memory cells;
a plurality of first switches coupled to the string select lines and the bit lines; and
a plurality of second switches coupled to the global signal lines and the bit lines;
wherein in a first phase, selecting a global signal line of the global signal lines to pull up the global signal line from a first reference voltage to a second reference voltage, selecting a first string select line of the string select lines to pull up the first string select line from the first reference voltage to a third reference voltage, unselecting a second string select line of the string select lines to keep the second string select line at the first reference voltage, selecting a first word line of the word lines to pull up the first word line from the first reference voltage to a fourth reference voltage, and unselecting a second word line of the word lines to pull up the second word line from the first reference voltage to a fifth reference voltage;

sensing during a second phase;

in a third phase, keeping the global signal line at the second reference voltage, unselecting the first string select line to pull down the first string select line from the third reference voltage to the first reference voltage, selecting the second string select line to pull up the second string select line from the first reference voltage to the third reference voltage, keeping the selected first word line at the fourth reference voltage, and keeping the unselected second word line at the fifth reference voltage; and sensing during a fourth phase.

10. The memory device according to claim 9, wherein
the memory device further includes a page buffer circuit and an accumulating circuit; and
data read from at least one selected memory cell among the memory cells is input to the page buffer circuit and the accumulating circuit for performing multiplication accumulation (MAC) to generate an output data.

11. The memory device according to claim 9, wherein the memory device further includes a plurality of memory planes; each of the memory planes includes an accumulating circuit; and accumulation and output of MAC operations are performed in pipeline.

12. The memory device according to claim 9, wherein
in a fifth phase, keeping the global signal line at the second reference voltage, keeping the selected second string select line at the third reference voltage, keeping the unselected first string select line at the first reference voltage, unselecting the first word line to pull up the first word line from the fourth reference voltage to the fifth reference voltage, and selecting the second word line to pull down the second word line from the fifth reference voltage to the fourth reference voltage; and sensing during a sixth phase.

* * * * *